(12) United States Patent
Ito (10) Patent No.: US 6,566,255 B2
(45) Date of Patent: May 20, 2003

(54) SOI ANNEALING METHOD AND SOI MANUFACTURING METHOD

(75) Inventor: Masataka Ito, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 29 days.

(21) Appl. No.: 09/961,420

(22) Filed: Sep. 25, 2001

(65) Prior Publication Data

US 2002/0058387 A1 May 16, 2002

(30) Foreign Application Priority Data

Sep. 28, 2000 (JP) ........................................ 2000-296470

(51) Int. Cl.[7] ............................................. H01L 21/44
(52) U.S. Cl. ..................... 438/660; 438/149; 438/308; 438/406; 438/455; 438/459; 438/478; 438/479; 438/480; 438/481; 438/795; 219/390
(58) Field of Search ............................... 438/660, 308, 438/795, 478, 459, 455, 479, 481, 480, 149, 406; 219/390

(56) References Cited

U.S. PATENT DOCUMENTS

| | | | |
|---|---|---|---|
| 4,692,994 A | * 9/1987 | Moniwa et al. | 438/152 |
| 5,371,037 A | 12/1994 | Yonehara | 437/86 |
| 5,374,564 A | 12/1994 | Bruel | 437/24 |
| 5,773,355 A | 6/1998 | Inoue et al. | 438/459 |
| 5,856,229 A | 1/1999 | Sakaguchi et al. | 438/406 |
| 5,863,830 A | 1/1999 | Bruel et al. | 438/478 |
| 5,869,387 A | 2/1999 | Sato et al. | 438/459 |
| 6,171,982 B1 | 1/2001 | Sato | 438/795 |
| 6,238,990 B1 | 4/2001 | Aga et al. | 438/308 |
| 6,407,367 B1 | * 6/2002 | Ito et al. | 219/390 |
| 6,413,874 B1 | * 7/2002 | Sato | 438/714 |

FOREIGN PATENT DOCUMENTS

| | | |
|---|---|---|
| EP | 0926707 A2 | 6/1999 |
| EP | 0926713 A2 | 6/1999 |
| JP | 5-021338 | 1/1993 |
| JP | 5-217821 | 8/1993 |
| JP | 7-302889 | 11/1995 |
| JP | 2-608351 | 5/1997 |
| JP | 11-145020 | 5/1999 |

OTHER PUBLICATIONS

Sadana, D.K., et al., Nanodefects in commercial bonded SOI and Simox, Proceedings 1994 IEEE International SOI Conference, Oct. 1994.

* cited by examiner

Primary Examiner—Caridad Everhart
Assistant Examiner—B V Keshavan
(74) Attorney, Agent, or Firm—Fitzpatrick, Cella, Harper & Scinto (57) ABSTRACT

The HF defect density in an SOI is reduced. An SOI having a thickness of 200 nm or less is annealed in an inert atmosphere at a temperature between the eutectic temperature (e.g., 966° C.) of a semiconductor metal compound (e.g., nickel silicide) formed from a metal and the semiconductor material of the crystal semiconductor of the SOI (inclusive) and the melting point of the semiconductor material (inclusive).

34 Claims, 5 Drawing Sheets

SOI ANNEALING METHOD AND SOI MANUFACTURING METHOD

FIELD OF THE INVENTION

The present invention relates to a method of annealing an SOI (semiconductor on insulator) having a crystal semiconductor layer on an insulator and an SOI manufacturing method. In this specification, the term SOI means an SOI layer, an SOI substrate, SOI wafer, SOI structure or the like.

BACKGROUND OF THE INVENTION

A technique of obtaining a surface with a high planarity by annealing an SOI in a reducing atmosphere is disclosed in, e.g., Japanese Patent Laid-Open No. 05-217821 (U.S. Pat. No. 5,869,387) by Sato et al. According to this prior art, for example, annealing at 1,000° C. in hydrogen gas yields so high planarity that the roughness on an SOI layer surface observed with an atomic force microscope is 2 nm or less. In addition, surface planarization by hydrogen annealing has a characteristic feature that any physical damage to a surface can be prevented, unlike polishing.

Another advantage of this technique is in its high productivity that can be obtained by executing batch processing using a multi-wafer-treating annealing apparatus such as a vertical diffusion furnace generally used for a semiconductor process.

A method of annealing an SOI wafer in a reducing atmosphere is described in Japanese Patent Laid-Open No. 11-145020 (U.S. Pat. No. 6,238,990), where in an SOI wafer annealing method of annealing an SOI wafer at a temperature of 1,100° C. to 1,300° C. for 1 to 60 sec using a rapid heating/cooling apparatus, COPs (Crystal Originated Particles) in the SOI wafer are eliminated by hydrogen annealing.

In recent SOI, a semiconductor layer on an insulator, i.e., a so-called SOI layer is required to be thin, and an SOI wafer having an SOI layer having a thickness smaller than e.g., 1 micrometer is desired.

However, some problems arise as an SOI layer becomes thinner. One of the problems is the problem of HF defects in an SOI layer.

Although the number of HF defects in an SOI is decreasing in recent years, they are not completely eliminated. HF defects are supposed to cause an operation error in an SOI device, and the defect density is required to be lower.

HF defects are unique to an SOI and are generated by dipping an SOI in hydrofluoric acid, as described in Sanada et al, "NANO-DEFECTS IN COMMERCIAL BONDED SOI AND SIMOX", Proceedings 1994 IEEE International SOI Conference, October 1994.

Probable causes for HF detects are metal contamination, pinholes in an SOI layer, and COPs in an SOI layer. For HF defects based on metal contamination, only an expensive measure which requires a costly investment for plant and equipment to minimize the metal contamination has been examined. No radical measure based on examination of relationship between meta contamination and HF defects has been taken.

SUMMARY OF THE INVENTION

It is an object of the present invention to provide an SOI annealing method and manufacturing method, which can reduce the HF defect density in a thin-film SOI having a thin SOI layer.

It is another object of the-present invention to provide an SOI annealing method and manufacturing method, which can reduce the number of HF defects caused by metal contamination at a relatively low cost.

According to an aspect of the present invention, there is provided an SOI annealing method comprising the first annealing step of annealing an SOI having a semiconductor layer with a thickness of not more than 200 nm on an insulator, such as an insulating layer, an insulating substrate or the like, in a first reducing atmosphere at a temperature not more than a melting point of silicon, and the second annealing step of, after the first annealing step, annealing the SOI in an inert atmosphere or a second reducing atmosphere weaker than the first reducing atmosphere at a temperature between 966° C. (inclusive) and the melting point of silicon (inclusive).

According to another aspect of the present invention, there is provided an SOI annealing method wherein an SOI having a semiconductor layer with a thickness of not more than 200 nm on an insulating surface is annealed in an inert atmosphere at a temperature between 966° C. (inclusive) and the melting point of silicon (inclusive).

According to still another aspect of the present invention, there is provided an SOI annealing method comprising the first annealing step of annealing an SOI having a semiconductor layer with a thickness of not more than 200 nm on an insulator, such as an insulating layer, an insulating substrate or the like, in a first reducing atmosphere at a temperature not more than a melting point of silicon, and the second annealing step of, after the first annealing step, annealing the SOI in an inert atmosphere or a second reducing atmosphere weaker than the first reducing atmosphere at a temperature between a eutectic temperature of a semiconductor metal compound formed from a metal and a semiconductor material of the semiconductor layer (inclusive) and the melting point of the semiconductor material (inclusive).

According to still another aspect of the present invention, there is provided an SOI annealing method wherein an SOI having a semiconductor layer with a thickness of not more than 200 nm on an insulator, such as an insulating layer, insulating substrate or the like, is annealed in an inert atmosphere at a temperature between a eutectic temperature of a semiconductor metal compound formed from a metal and a semiconductor material of the semiconductor layer (inclusive) and a melting point of the semiconductor material (inclusive).

As will be described later, the present inventor found that the cause of HF defects based on metal contamination was a compound of the semiconductor material of an SOI layer and a metal contaminant and that when the compound was decomposed, it was removed, and the number of formed HF defects was decreased.

The present inventor also found that the number of HF defects increased/decreased depending on the metal contamination concentration and that the metal contamination concentration depended on the degree of reduction of an annealing atmosphere, and metal contamination during annealing could be reduced by using a weak reducing atmosphere.

In an SOI layer thinner than 1 micrometer, HF defects pose a serious problem even with the slightest amount of metal contamination.

According to the present invention, even when an SOI layer is contaminated in the first annealing step or due to another reason, at least part of the produced semiconductor metal compound can be decomposed by annealing the SOI at a temperature equal to or more than the eutectic point of the semiconductor metal compound formed from a metal and the semiconductor material of the SOI layer. At this time, when a weak reducing atmosphere or inert atmosphere is used, deposition of the semiconductor metal compound can be suppressed while preventing the SOI layer from being contaminated by the metal again.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

An outline of an SOI annealing method according to the present invention will be described with reference to FIG. 1.

An SOI which has a semiconductor layer (SOI layer) with a thickness of 200 nm or less on an insulating substrate (a substrate having an insulating layer on its surface or a substrate made of an insulating material) is prepared. The manufacturing method for manufacturing such SOI is described later.

Figure 1:
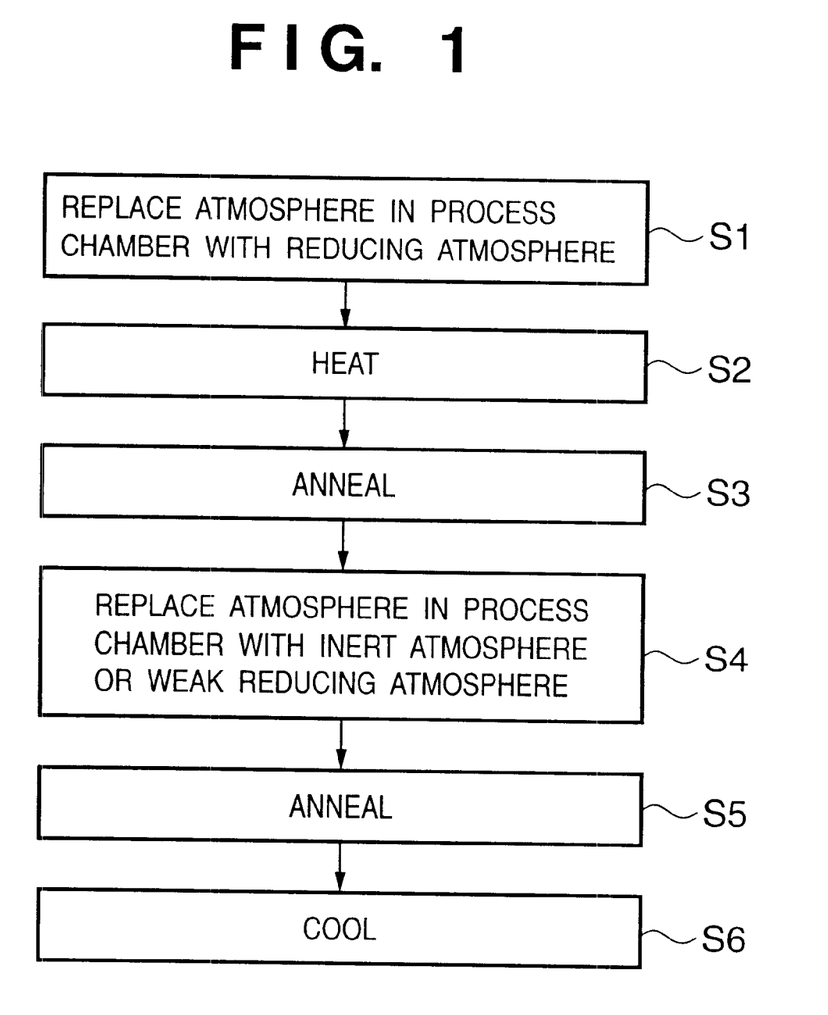
FIG. 1 is a flow chart of an annealing method according to the present invention.

As shown in FIG. 1, in step S1, the SOI is placed in a process chamber for annealing, and a reducing gas is supplied into the process chamber to replace the internal atmosphere with a reducing atmosphere for the first annealing step to be described later.

In heating step S2, the heater of the annealing apparatus is activated to heat the SOI to a predetermined annealing temperature.

In first annealing step S3, the SOI is annealed at the predetermined temperature for a predetermined time. The annealing temperature at this time falls within the range between a temperature necessary for SOI layer processing such as annealing for correcting defects in the SOI layer and/or planarization processing for planarizing the surface of the SOI layer and the melting point of the semiconductor material contained in the SOI layer. To do this, the SOI is preferably annealed in a reducing atmosphere. This reducing atmosphere is preferably a 100% hydrogen atmosphere or a reducing atmosphere containing hydrogen and an inert gas. In the latter case, the hydrogen concentration is preferably, e.g., 30 vol % or more. The temperature required to process the SOI layer falls within the range of 900° C. to 1,250° C. and preferably within the range of 1,000° C. to 1,150° C. Hence, e.g., the first annealing step can be executed at 1,050° C. or 1,100° C.

In step S4, the above-described reducing atmosphere in the process chamber is replaced with another atmosphere for the second annealing step. This atmosphere is a reducing atmosphere weaker than the above reducing atmosphere, or an inert atmosphere. For example, at least one inert gas selected from rare gases such as helium, neon, argon, and krypton and nitrogen gas is used. Alternatively, a gas obtained by adding, to the inert gas, hydrogen at a concentration that makes a reducing atmosphere much weaker than the first annealing atmosphere is used. A weak reducing atmosphere means that the hydrogen concentration is relatively low. More specifically, the hydrogen concentration is preferably set at 25 vol % or less and, more preferably, 10 vol % or less. The process atmosphere can be replaced in step S4 by decreasing the flow rate of hydrogen that has been supplied to the furnace in step S3 or supplying an inert gas such as argon (or increasing the flow rate of an inert gas that has already been supplied). Not an inert gas but a gas such as nitrogen may be used as far as a weaker reducing atmosphere can be obtained.

In second annealing step S5, the SOI is annealed in a weak reducing atmosphere or in an inert atmosphere. The annealing temperature at this time falls within the range between the eutectic temperature of a semiconductor metal compound formed from a metal and the semiconductor material of the SOI layer and the melting point of the semiconductor material.

Even when the SOI layer is contaminated by a metal in the first annealing step, at least part of the produced semiconductor metal compound can be decomposed by annealing the SOI at a temperature equal to or higher than the eutectic point of the semiconductor metal compound formed from the metal and the semiconductor material of the SOI layer. At this time, a weak reducing atmosphere or an inert atmosphere is used to remove at least part of the decomposed metal with the gas flow and prevent the SOI layer from being contaminated by the metal again, thereby suppressing deposition of the semiconductor metal compound.

In cooling step S6, the temperature of the SOI is reduced, and the SOI is extracted from the process chamber. A resultant thin-film SOI has a few HF defects and contains the metal contaminant at a low concentration.

Metal contamination does not always occur in the first annealing step. When an SOI contaminated by a metal is annealed by a method to be described below, metal contamination can be reduced, and HF defects can be suppressed.

The annealing temperature ($T_1$) in the first annealing step and the annealing temperature ($T_2$) in the second annealing step can have any one of relations $T_1=T_2$, $T_1>T_2$, and $T_1<T_2$ as long as a weaker reducing atmosphere can be obtained in the second annealing step than in the first annealing step by replacing the atmospheric gas in the furnace. The preferable relation is $T_1=T_2$, since such a relation does not require changing the annealing temperature between the first and second annealing steps.

Figure 2:
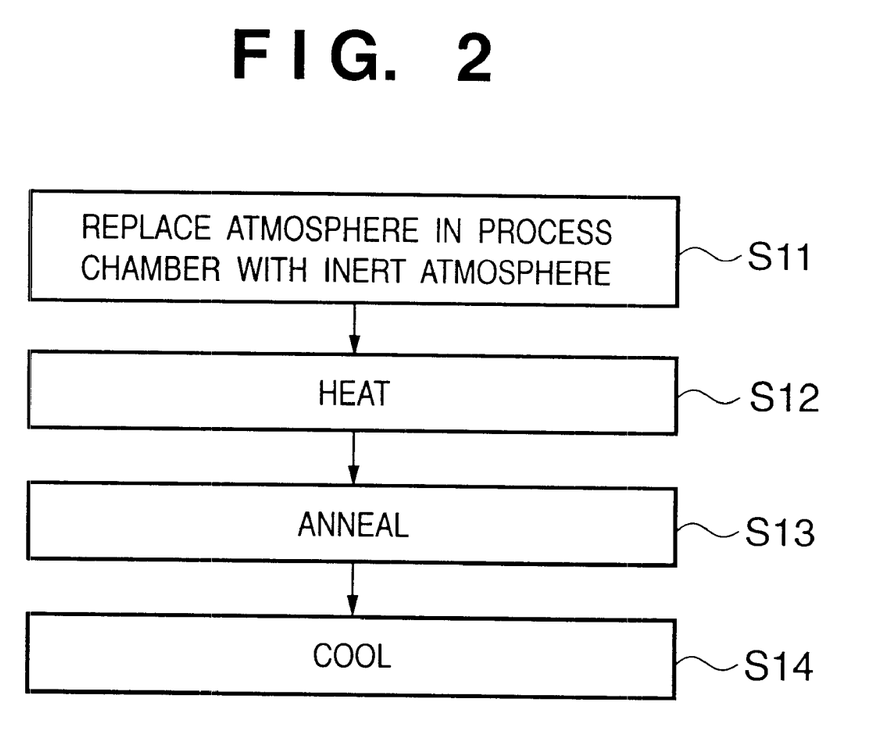
FIG. 2 is a flow chart of another annealing method according to the present invention.

As shown in FIG. 2, in step S11, an SOI having an SOI layer with a thickness of 200 nm or less is placed in a process chamber for annealing, and an inert gas is supplied into the process chamber to replace the internal atmosphere with an inert atmosphere for the annealing step to be described later. As the inert gas, for example, at least one inert gas selected from rare gases such as helium, neon, and argon and nitrogen gas is used.

In heating step S12, the heater of the annealing apparatus is activated to heat the SOI to a predetermined annealing temperature.

In annealing step S13, the SOI is annealed in this inert atmosphere. The annealing temperature at this time falls within the range between the eutectic temperature of a semiconductor metal compound formed from a metal and the semiconductor material of the SOI layer and the melting point of the semiconductor material.

Even when the SOI layer is contaminated by a metal, at least part of the produced semiconductor metal compound can be decomposed by annealing the SOI at a temperature equal to or higher than the eutectic point of the semiconductor metal compound formed from the metal and the semiconductor material of the SOI layer. At this time, an inert atmosphere is used to remove at least part of the decomposed metal with the gas flow and prevent the SOI layer from being contaminated by the metal again, thereby suppressing deposition of the semiconductor metal compound.

In cooling step S14, the temperature of the SOI is reduced, and the SOI is extracted from the process chamber. The resultant thin-film SOI has a few HF defects and contains the metal contaminant at a low concentration.

As an SOI to be processed by the present invention, an SOI wafer having a crystal semiconductor layer formed on a handle substrate such as a silicon substrate via an insulating layer or an SOI wafer having a crystal semiconductor layer formed on an insulating substrate such as a silica glass substrate directly or via an insulating layer is used.

As a crystal semiconductor layer, a single-crystal semiconductor such as silicon or silicon germanium that contains silicon as a major component is preferably used. Especially, an epitaxially grown single-crystal semiconductor layer containing no COPs is more preferably used because HF defects due to COPs can be eliminated.

The above crystal semiconductor layer may be a polycrystal semiconductor. Alternatively, a semiconductor layer such as Si, Ge, SiGe, SiC, C, GaAs, GaN, AlGaAs, InP, or InAs, or a semiconductor layer containing a plurality of types of semiconductor layers may be used. For example, an Si layer is formed on an SiGe layer, or an SiGe layer is formed on an Si layer. The above crystal semiconductor layer may be formed from a plurality of semiconductor layers having the same composition but different impurity concentrations or different resistivity values (e.g., a semiconductor layer formed from a silicon layer having the first resistivity value and a silicon layer formed on that silicon layer and having the second resistivity value different from the first resistivity value).

An SOI may be an intermediate product or a finished product formed by a SIMOX or bonding method. Especially, the present invention can be preferably applied to an SOI obtained by forming a porous layer on a donor wafer, epitaxially growing a non-porous single-crystal semiconductor layer on the porous layer, bonding the resultant structure to a handle wafer, and then separating the bonded substrate stack at the porous layer, or an SOI obtained by implanting ions of hydrogen or the like into a donor wafer, bonding the donor wafer to a handle wafer, and then separating the bonded substrate stack at a relatively heavily ion-implanted layer. A method for producing an SOI using a hydrogen implantation technique is called Smart Cut__.

The present invention can be especially preferably applied to bonding methods described in Japanese Patent Application No. 2608351, U.S. Pat. No. 5,371,037, Japanese Patent Laid-Open No. 7-302889, and U.S. Pat. No. 5,856,229, i.e., SOI wafer manufacturing methods in which a porous layer is formed on a first substrate (donor wafer), a non-porous epitaxial layer is formed on the porous layer, the resultant structure is bonded to a second substrate (handle wafer), unnecessary portions including the porous layer are removed, and then the surface of the SOI layer is planarized. The porous layer is formed by e.g., an anodization method.

Metal contamination here mainly means metal contamination observed in intermediate products which are not completed yet as SOI wafers to be shipped as merchandise. Not many completed high-quality SOI wafers have serious metal contamination.

According to analysis by the present inventor, no serious metal contamination is observed in a completed SOI wafer obtained by the above-described SOI wafer manufacturing method using a porous layer. The metal contamination level in an intermediate product by this method is much lower than metal contamination that poses a problem in a normal semiconductor manufacturing process. The metal contamination concentration on an SOI wafer surface is as low as, e.g., about $1 \times 10^9$ atoms/cm$^2$ to $2 \times 10^9$ atoms/cm$^2$. The present invention can be very effectively applied to remove HF defects due to such low-level metal contamination.

In the present invention, the annealing temperature falls within the range between the melting point of a semiconductor metal compound and the melting point of the semiconductor of the SOI. To reduce HF defects due to nickel contamination, the annealing temperature is preferably set to be equal to or more than 966° C. that is the eutectic temperature of nickel silicide. The annealing temperature is more preferably set to be equal to or more than 993° C. that is the melting point of nickel silicide. The upper limit is preferably set at 1,300° C. or less.

Examples of a semiconductor metal compound are metal silicides such as nickel silicide, manganese silicide, and iron silicide. Examples of a metal that causes metal contamination are transition metals such as nickel, manganese, and iron. Iron silicide has a production temperature of 550° C., a eutectic temperature of 1,208° C., and a melting point of 1,212° C. to 1,220° C. Hence, the annealing temperature is preferably set at 1,208° C. or more. Manganese silicide has a production temperature of 800° C., an unknown eutectic temperature, and a melting point of 1,150° C. Hence, when the annealing temperature is set to be equal to or more than the melting point with some margin, a desired effect can be obtained.

For nickel, the metal contamination concentration on an SOI surface before annealing can be $1 \times 10^9$ atoms/cm$^2$ or more or $2 \times 10^9$ atoms/cm$^2$ or more. Even for an SOI for which the nickel concentration on the SOI surface is increased to $1 \times 10^9$ atoms/cm$^2$ or more or $2 \times 10^9$ atoms/cm$^2$ or more by the first annealing step, HF defects can be suppressed, and the metal contamination concentration can be made lower than the above concentration by annealing of the present invention (second annealing step).

The "nickel concentration on an SOI wafer surface" is obtained by recovering metal impurities present on the wafer surface into a liquid such as pure water or an acid solution, measuring the metal concentration of each element in the liquid using an ICP-MS (Inductively Coupled Plasma Mass Spectroscopy) apparatus or the like, and converting a measured value to the number of metal atoms per wafer unit area.

Even at the same metal contamination concentration, few HF defects by a metal are produced in an SOI layer having a thickness of about 1 micrometer, while HF defects due to a metal are conspicuous in a thin-film SOI with a thickness of 200 nm or less. For example, when the nickel concentration is $1 \times 10^9$ atoms/cm$^2$ or more, HF defects are conspicuous.

As an annealing apparatus for in the present invention, a multi-wafer-treating or single-wafer-treating annealing apparatus is used. As an annealing scheme, lamp heating or induction heating can be used. A rapid heating/cooling annealing apparatus may be used. A multi-wafer-treating annealing apparatus can have either a vertical furnace or a horizontal furnace.

When an SOI is formed by the above-described bonding method, the following method can be used, as needed, to decrease the thickness of the semiconductor layer on the insulating member to 200 nm or less. For example, an SOI having a semiconductor layer with a thickness of 200 nm or more on an insulating member is prepared, and an oxide film is formed on the surface of the semiconductor layer. The oxide film can be removed by etching in a liquid phase or vapor phase. In this case, the thickness of the semiconductor layer can be decreased without polishing.

(First Embodiment)

Figure 3:
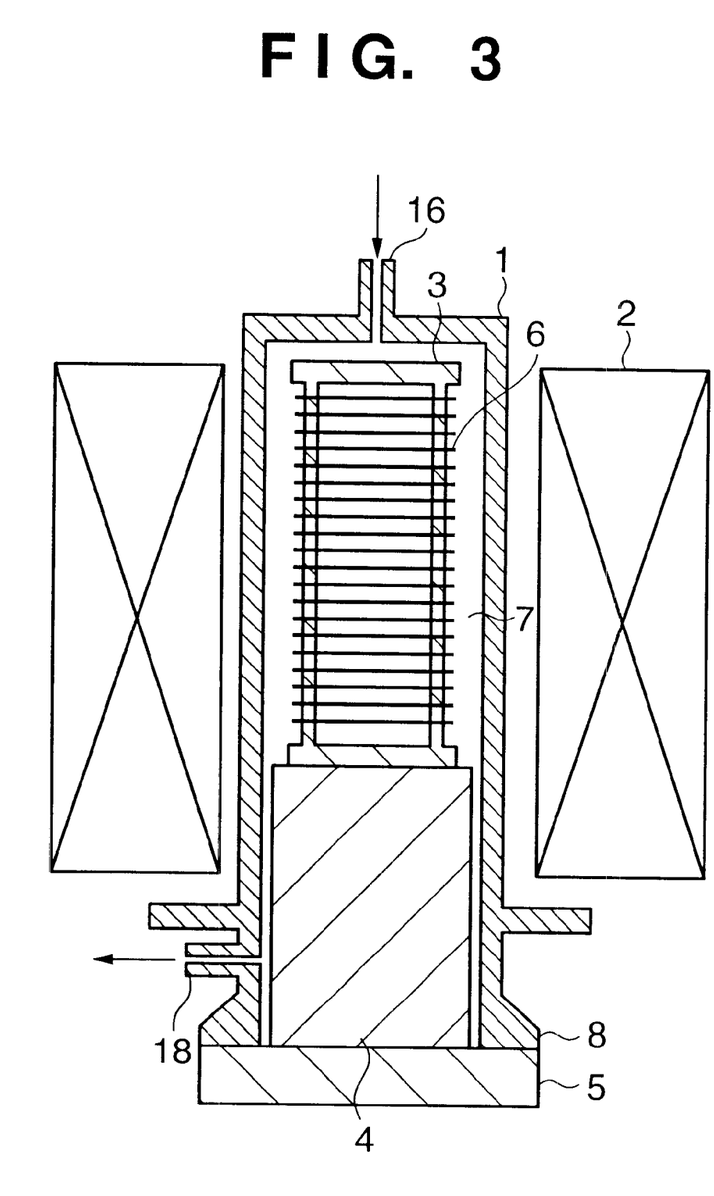
FIG. 3 is a schematic longitudinal sectional view of an annealing apparatus used in the present invention.

FIG. 3 is a longitudinal sectional view showing the schematic arrangement of an annealing apparatus used in the present invention.

Referring to FIG. 3, reference numeral 1 denotes a process chamber. The annealing chamber 1 is designed to supply an annealing atmospheric gas from a supply port 16 provided at the upper portion of a furnace tube formed from silica glass or the like and exhaust the gas from an exhaust port 18 at the lower portion. Reference numeral 2 denotes a heater such as an induction heater; and 3, a holding means for holding objects 6 to be processed, which are placed on a heat barrier 4 arranged on a furnace lid 5. This holding means is a boat made of, e.g., silicon carbide and can hold a plurality of objects 6 such as SOI wafers to be processed. As the material of the boat 3, silicon carbide manufactured by sintering is used. The boat 3 may have a coating of silicon carbide that is chemically synthesized by chemical vapor phase deposition on a surface of a silicon carbide body/base manufactured by sintering. Although not illustrated, a load/unload chamber for the objects to be processed is arranged on the lower side of the furnace tube so that the objects to be processed can be loaded or unloaded by moving the furnace lid 5 downward.

The above-described annealing method of the present invention can be practiced in accordance with the procedure shown in FIG. 1 using the apparatus shown in FIG. 3.

The furnace lid 5 is moved downward in advance. The plurality of SOI wafers 6 as objects to be processed are set in the boat 3. The thickness of the SOI layer of each SOI wafer is 200 nm or less. The furnace lid 5 is moved to the position shown in FIG. 3 to place the SOI wafers 6 in a process chamber 7 and close an opening portion 8 of the furnace tube 1. The furnace lid 5 is operated by an elevating mechanism (not shown). The interior of the process chamber 7 is pre-heated to, e.g., about 600° C., i.e., a temperature lower than the actual annealing temperature. To prevent oxidation of the surfaces of the SOI wafers, nitrogen gas is preferably supplied into the processing space 7, as needed, to set an inert gas atmosphere.

Subsequently, hydrogen gas of 100 vol % or an inert gas containing hydrogen of, e.g., 30 vol % is supplied from the supply port 16 to the processing space 7 to replace the atmosphere in the process chamber 1 with a reducing atmosphere containing hydrogen (step S1).

Next, the processing space 7 is heated to a predetermined processing temperature by the heater 2, thereby heating the SOI wafers 6 to a temperature higher than 775° C., e.g., 1,050° C. (step S2). In such an apparatus, if the temperature in the process chamber 1 is 775° C. or more, it can be regarded that the temperature of the SOI wafers is also 775° C. or more.

In annealing step S3, annealing is executed for, e.g., 1 hr or more.

Supply of hydrogen gas is stopped. Argon gas is supplied from the supply port 16 to the processing space 7 to replace the atmosphere in the process chamber 1 with an inert atmosphere containing argon (step S4). Instead of the inert atmosphere containing argon, hydrogen diluted with argon may be supplied to obtain a weak reducing atmosphere containing hydrogen at a concentration of 25 vol % or less and, more preferably, 10 vol % or less.

The processing space 7 is heated to a predetermined processing temperature by the heater 2. The SOI wafers 6 are heated to a temperature higher than 966° C., e.g., 1,100° C. and annealed for, e.g., 1 min or more (step S5).

In step S6, the power supply to the heater 2 is reduced to lower the temperature of the SOI wafers to a predetermined pre-heat temperature (e.g., 600° C.) lower than 775° C.

After the predetermined pre-heat temperature is obtained, the atmosphere in the process chamber 1 is replaced as needed. After that, the furnace lid 5 is moved downward, and the SOI wafers 6 are extracted from the boat or together with the boat.

SOI wafers obtained in the above way have few HF defects.

The relationship between HF defects and metal contamination will be described.

When SOI wafers were annealed in a reducing atmosphere at a high temperature using the multi-wafer-treating annealing apparatus shown in FIG. 3, the number of HF defects in SOI layers sometimes increased. The present inventor extensively studied the increased HF defects and found that an increase in number of HF defects was related to metal contamination by, e.g., nickel that was produced in a very small amount in wafers by annealing. That is, when the surface or interior of an SOI layer is contaminated by a metal during annealing, a crystallite of deposit (semiconductor metal compound) is produced as the metal bonds to silicon in the cooling process. This compound is removed by hydrofluoric acid and appears as HF defects.

It is often difficult to reduce metal contamination in a reducing atmosphere as compared in an oxidizing atmosphere. A probable source of metal contamination is the annealing apparatus. To reduce the metal contamination, the annealing apparatus may be improved. However, since members used in a multi-wafer-treating annealing apparatus become large and complex in accordance with the number of wafers to be processed, it is economically and technically difficult to make all members using very pure materials, and it is also hard to manage the very low metal contamination concentration to a lower level. For example, a boat, i.e., a holding member used to simultaneously process 100 or more SOI wafers is as long as 1 m or more and has 400 or more grooves to hold wafers. If the boat is manufactured using a material with a high purity, the cost becomes high, and management such as inspection and exchange/cleaning operations is not easy.

According to the above-described embodiment, even for an SOI wafer for which the nickel concentration on the SOI surface is $1\times10^9$ atoms/cm$^2$ or more or an SOI wafer for which the nickel concentration on the SOI surface increases to $1\times10^9$ atoms/cm$^2$ or more by annealing, HF defects due to metal contamination can be suppressed without using any expensive apparatus using materials with high purity.

(Second Embodiment)

The annealing method of the present invention can be practiced in accordance with the procedure shown in FIG. 2 using the apparatus shown in FIG. 3.

A plurality of SOI wafers each of which has a SOI layer with a thickness of 200 nm or less and a nickel concentration of $1 \times 10^9$ atoms/cm$^2$ or more are prepared.

A furnace lid 5 is moved downward in advance. A plurality of SOI wafers 6 as objects to be processed are set in a boat 3. The furnace lid 5 is moved to the position shown in FIG. 3 to place the SOI wafers 6 in a process chamber 7 and close an opening portion 8 of a furnace tube 1. The furnace lid 5 is operated by an elevating mechanism (not shown). The interior of the process chamber 7 is pre-heated to, e.g., about 600° C., i.e., a temperature lower than the actual annealing temperature. To prevent oxidation of the surfaces of the SOI wafers, nitrogen gas is preferably supplied into the processing space 7, as needed, to form an inert gas atmosphere.

Subsequently, argon gas is supplied from a supply port 16 to the processing space 7 to replace the atmosphere in the process chamber 1 with an inert atmosphere containing argon (step S11).

The processing space 7 is heated to a predetermined processing temperature by a heater 2. The SOI wafers 6 are heated to a temperature higher than 966° C., e.g., 1,100° C. (S12) and annealed for, e.g., 1 min or more (step S13).

After that, the power supply to the heater 2 is reduced to lower the temperature of the SOI wafers to a predetermined pre-heat temperature (e.g., 600° C.) lower than 775° C. (step S14). After the predetermined pre-heat temperature is obtained, the atmosphere in the process chamber 1 is replaced as needed. After that, the furnace lid 5 is moved downward, and the SOI wafers 6 are extracted from the boat or together with the boat.

SOI wafers obtained in the above way have few HF defects.

(Third Embodiment)

Figure 4:
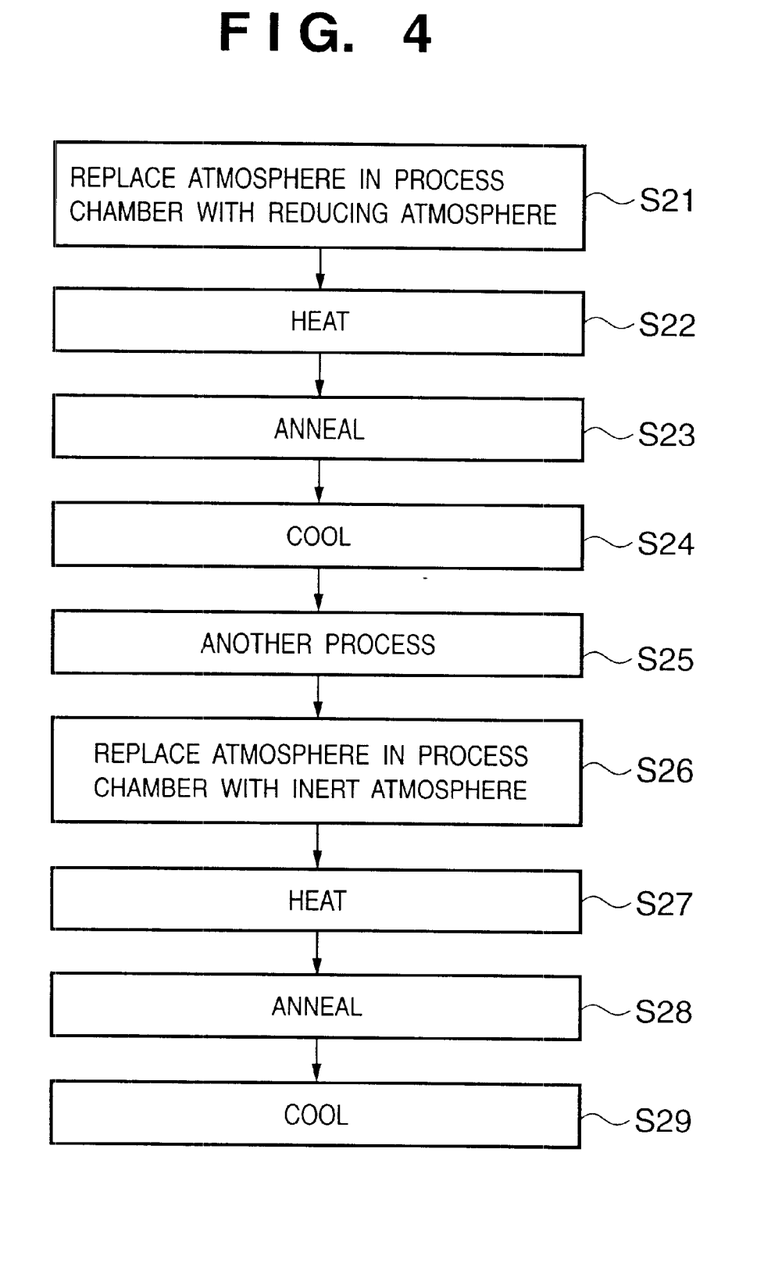
FIG. 4 is a flow chart showing still another annealing method according to the present invention.

SOI annealing can be practiced in accordance with the procedure shown in FIG. 4 using the apparatus shown in FIG. 3.

A furnace lid 5 is moved downward in advance. A plurality of SOI wafers 6 as objects to be processed are set in a boat 3. The thickness of the SOI layer of each SOI wafer is 200 nm or less. The furnace lid 5 is moved to the position shown in FIG. 3 to place the SOI wafers 6 in a process chamber 7 and close an opening portion 8 of the furnace tube 1. The furnace lid 5 is operated by an elevating mechanism (not shown). The interior of the process chamber 7 is pre-heated to, e.g., about 600° C., i.e., a temperature lower than the actual annealing temperature. To prevent oxidation of the surfaces of the SOI wafers, nitrogen gas is preferably supplied into the processing space 7, as needed, to set an inert gas atmosphere.

Subsequently, hydrogen gas of 100 vol % or an inert gas containing hydrogen of, e.g., 30 vol % is supplied from a supply port 16 to the processing space 7 to replace the atmosphere in the process chamber 1 with a reducing atmosphere containing hydrogen (step S21).

Next, the processing space 7 is heated to a predetermined processing temperature by a heater 2, thereby heating the SOI wafers 6 to a temperature higher than 775° C., e.g., 1,050° C. (step S22). In annealing step S23, annealing is executed for, e.g., 1 hr or more.

The heating temperature of the heater 2 is reduced to cool the processing space 7 to about 600° C. (step S24). The atmosphere in the process chamber 1 is replaced with nitrogen gas, and the furnace lid 5 is moved downward to extract the SOI wafers 6. Predetermined inspection processing such as measurement of the characteristics of the SOI wafers or measurement of defects, or fabrication processing is executed (step S265).

The SOI wafers 6 are placed in the process chamber 7 again. At this time as well, the interior of the processing space 7 is pre-heated to, e.g., about 600° C., i.e., a temperature lower than the actual annealing temperature. In addition, nitrogen gas is supplied into the processing space 7 as needed to form an inert gas atmosphere.

Supply of nitrogen gas is stopped. Argon gas is supplied from the supply port 16 to the processing space 7 to replace the atmosphere in the process chamber 1 with an inert atmosphere containing argon (step S26). Instead of the inert atmosphere containing argon, hydrogen diluted with argon may be supplied to obtain a weak reducing atmosphere containing hydrogen at a concentration of 25 vol % or less and, more preferably, 10 vol % or less.

The processing space 7 is heated to a predetermined processing temperature by the heater 2. The SOI wafers 6 are heated to a temperature higher than 966° C., e.g., 1,100° C. (step S27) and annealed for, e.g., 1 min or more (step S28).

In step S29, the power supply to the heater 2 is reduced to lower the temperature of the SOI wafers to a predetermined pre-heat temperature (e.g., 600° C.) lower than 775° C.

After the predetermined pre-heat temperature is obtained, the atmosphere in the process chamber 1 is replaced as needed. After that, the furnace lid 5 is moved downward, and the SOI wafers 6 are extracted from the boat or together with the boat.

SOI wafers obtained in the above way have few HF defects.

(Fourth Embodiment)

In the above-described third embodiment, steps S26 to S29 are executed using another annealing apparatus, e.g., a rapid heating/cooling annealing apparatus called an RTA or RTP.

(Fifth Embodiment)

In the procedure shown in FIG. 1, 100% hydrogen gas is supplied into the process chamber, and the first annealing is executed for an SOI at 1,050° C. for 3 hrs.

The atmosphere is replaced with a rare gas such as 100% argon (or He, Ne, or Kr) without reducing the temperature. Then, the temperature is increased to 1,150° C., and the second annealing is executed for the SOI for 1 hr.

(Sixth Embodiment)

In the procedure shown in FIG. 1, 100% hydrogen gas is supplied into the process chamber, and the first annealing is executed for an SOI at 1,050° C. for 3 hrs.

A rare gas such as argon (or He, Ne, or Kr) is supplied without reducing the temperature to form a weak reducing atmosphere in the process chamber, and the second annealing is executed for the SOI. When the hydrogen concentration decreases to 5 vol % along with the supply of the rare gas such as argon (or He, Ne, or Kr), heating is stopped.

(Seventh Embodiment)

In the procedure shown in FIG. 1, hydrogen gas is added to a rare gas such as argon (or He, Ne, or Kr) in the process chamber. When the hydrogen concentration reaches 50 vol % as the hydrogen gas is added, the first annealing is executed for an SOI at 1,050° C. for 3 hrs.

The adding amount of hydrogen gas is decreased without reducing the temperature. When the hydrogen concentration decreases to 5 vol %, the second annealing is executed for the SOI in this weak reducing atmosphere.

(Eighth Embodiment)

In the procedure shown in FIG. 1, hydrogen gas is added to a rare gas such as argon (or He, Ne, or Kr) in the process chamber. In an atmosphere containing hydrogen at a concentration of 90 vol %, an SOI is heated at 1,050° C.

The adding amount of hydrogen gas is gradually decreased without reducing the temperature. The hydrogen concentration is decreased to 5 vol % for 4 hrs, and then heating is stopped.

(Ninth Embodiment)

In the procedure shown in FIG. 1, hydrogen gas is supplied into the process chamber. The first annealing is executed in an atmosphere containing hydrogen at a concentration of 100 vol % at 1,050° C. for 3 hrs.

The atmosphere is replaced with a rare gas such as argon (He, Ne, or Kr) without reducing the temperature. The temperature is reduced to 775° C., 966° C., or 993° C., and the second annealing is executed for 2 hrs.

(10th Embodiment)

In the procedure shown in FIG. 1, hydrogen gas is supplied into the process chamber. The first annealing is executed in an atmosphere containing hydrogen at a concentration of 100 vol % at 1,050° C. for 3 hrs.

The atmosphere is replaced with a rare gas such as argon (He, Ne, or Kr) without reducing the temperature. The temperature is reduced to 775° C., 966° C., or 993° C., and the second annealing is executed for 2 hrs.

(11th Embodiment)

In the procedure shown in FIG. 1, hydrogen gas is supplied into the process chamber. An SOI is held first in an atmosphere containing hydrogen at a concentration of 100 vol % at 775° C. for 1 hr, the temperature is then increased to 1,050° C., and the SOI is held for 2 hrs, thereby executing the first annealing.

The atmosphere is replaced with a rare gas such as argon (He, Ne, or Kr) without reducing the temperature, and the second annealing is executed for 2 hrs.

(12th Embodiment)

In the procedure shown in FIG. 1, hydrogen gas is supplied into the process chamber. The first annealing is executed for an SOI in an atmosphere containing hydrogen at a concentration of 100 vol % at 1,050° C. for 3 hrs.

The atmosphere is replaced with a rare gas such as argon (He, Ne, or Kr) without reducing the temperature, and the SOI is held for 1 hr. The temperature is reduced to 993° C., and the SOI is held for 1 hr. Then, the temperature is reduced to 966° C., and the SOI is held for 1 hr. Finally, the temperature is reduced to 775° C., and the SOI is held for 1 hr, thereby executing the second annealing.

(13th Embodiment)

Hydrogen gas is supplied into the process chamber. The first annealing is executed in an atmosphere containing hydrogen at a concentration of 100 vol % at 1,050° C. for 1 hr.

The atmosphere is replaced with a rare gas such as argon (He, Ne, or Kr) without reducing the temperature, and the second annealing is executed for 1 hr.

The atmosphere is replaced with hydrogen gas again without reducing the temperature. The first annealing is executed in an atmosphere containing hydrogen at a concentration of 100 vol % at 1,050° C. for 1 hr. The atmosphere is replaced with a rare gas such as argon (He, Ne, or Kr) again without reducing the temperature, and the second annealing is executed for 1 hr.

The first and second annealing processes are repeated twice to 10 times or more.

Finally, heating is stopped in a rare gas atmosphere of argon (or He, Ne, or Kr).

(14th Embodiment)

An SOI manufacturing method according to an embodiment of the present invention will be described with reference to FIGS. 5A to 5D.

Figure 5A:
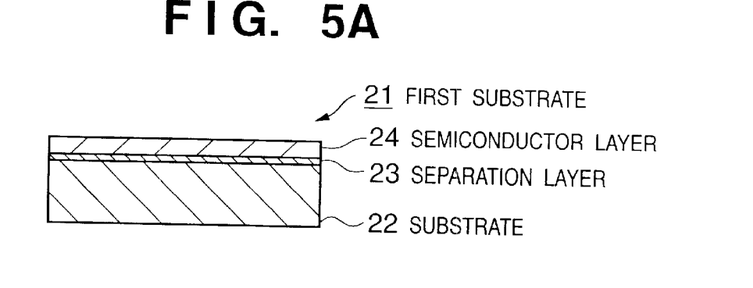
FIGS. 5A to 5D are views for explaining an SOI manufacturing method according to the present invention.

As shown in FIG. 5A, a first substrate 21 having a separation layer 23 inside is prepared.

This substrate is manufactured in the following way.

First method: A substrate 22 such as a single-crystal silicon wafer is prepared, and a porous layer serving as the separation layer 23 is formed by anodizing the substrate surface. This porous layer is formed from a plurality of layers having different porosities, as needed. If necessary, after the inner surfaces of pores in the porous layer are oxidized, annealing is executed in a reducing atmosphere containing hydrogen and/or a reducing atmosphere containing a trace amount of a source gas, thereby sealing pores on the surface of the porous layer. A non-porous single-crystal semiconductor layer 24 is formed on the porous layer. Thus, the first substrate 21 is obtained.

Second method: a substrate 22 such as a single-crystal silicon wafer is prepared, an insulating layer is formed on the substrate surface as needed, and ions of a rare gas such as helium, neon, or argon, nitrogen ions, or hydrogen ions are implanted such that a peak concentration is formed near a depth where a separation layer 23 is to be formed. In this way, a layer in which the implanted particles have a peak concentration at a predetermined depth in the substrate 22 can be obtained. Since microbubbles, defects, or distortion is locally generated near the peak concentration, the mechanical strength locally degrades, and this layer acts as the separation layer 23 in the separation process later. The surface portion of the substrate 22 on the separation layer 23 is a semiconductor layer 24.

Thus, the first substrate 21 is obtained.

Figure 5B:
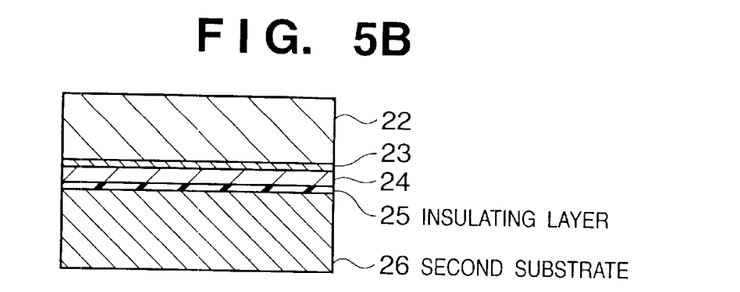

As shown in FIG. 5B, a second substrate 26 such as a silicon wafer or silica glass wafer different from the first substrate 21 is prepared and bonded to the first substrate 21. At this time, at least one of the substrates has an insulating surface.

In the example shown in FIG. 5B. an insulating layer 25 is formed on a surface of at least one of the first substrate 21 and second substrate 26, and the substrates are bonded.

Figure 5C:
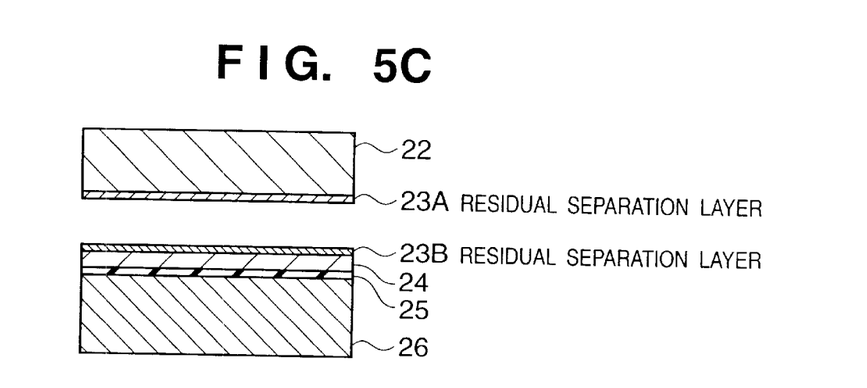

As shown in FIG. 5C, an external force is applied to the first and second substrates 21 and 26 to separate them at the separation layer 23. In the separation layer 23 and at its upper and lower interfaces, since the mechanical strength is low, or stress concentrates, a crack is formed in the separation layer 23 or at its upper and lower interfaces by the separating force. To apply an external force, the bonded substrate stack is simply pulled, a jet of a fluid is injected to the side surface of the bonded substrate stack, a hydrostatic pressure is applied using a fluid, or a solid wedge is inserted into the side surface of the bonded substrate stack. Alternatively, the separation layer 23 may be irradiated with light, or the bonded substrate stack may be heated to generate a force in the separation layer. These methods may be combined to separate the bonded substrate stack.

Figure 5D:
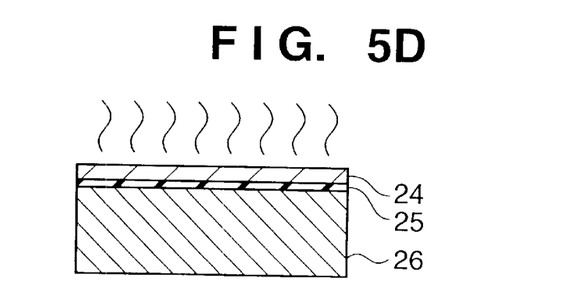

A non-porous semiconductor layer is transferred to the second substrate 26. When a residual separation layer 23B remaining on the surface (separation surface) is relatively thick, the residual separation layer is removed as needed to planarize the surface, thereby forming an SOI as shown in FIG. 5D. The annealing method of the present invention is preferably used for an SOI immediately after separation, an SOI after the residual separation layer is removed, or an SOI after surface planarization by polishing is executed. Detailed examples of the annealing method are the same as the above-described first to 13th embodiments. Especially, it is more preferable to execute processing shown in FIG. 1 or 4 after the residual separation layer is wet-etched or to execute processing shown in FIG. 1 or 4 after the bonded substrate stack is separated at the separation layer by ion implantation.

After that, fabrication processing for the edge of the SOI layer or cleaning processing for removing various kinds of contamination is performed, thereby obtaining an SOI as a finished product.

When a residual porous layer 23A remains on the substrate 22 of the separated first substrate, the substrate can be used again as the substrate 22 shown in FIG. 5A by removing the residual porous layer as needed.

EXAMPLE

An example of the present invention will be described below.

A plurality of SOI wafers each having a 100-nm thick SOI layer and a 100-nm thick buried oxide layer were prepared.

The SOI wafers were loaded into the annealing apparatus shown in FIG. 3, and annealing was executed in a 100% hydrogen gas atmosphere at 1,050° C. for 3 hrs as the first annealing step.

The hydrogen gas was replaced with argon gas, and annealing was executed in a 100% argon gas atmosphere at 1,050° C. for 2 hrs as the second annealing step.

The surface planarity of each of an SOI wafer as a comparative example that underwent only the first annealing and the SOI wafer of this example, which underwent the first and second annealing processes, was observed with an atomic force microscope. Both wafers had excellent surface planarity equivalent to that of a mirror-polished mirror wafer.

The SOI wafer as a comparative example that underwent only the first annealing and the SOI wafer of this example, which underwent the first and second annealing processes, were dipped in hydrofluoric acid for 15 min. Then each other was observed in its predetermined range with an optical microscope. The number of HF defects was counted, and the number of HF defects is divided by the observation area, thereby obtaining an HF defect density. The results are shown in Table 1.

TABLE 1

|  | Example | Comparative example |
| --- | --- | --- |
| HF defect density | 0.04 defects/cm² | 0.22 defects/cm² |

According to this example, the HF defect density on the SOI wafer could be reduced to about ⅕ that of the comparative example, and the HF defect density could be reduced to 0.05 defects/cm² or less.

According to the present invention, an SOI with a low HF defect density can be provided.

As many apparently widely different embodiments of the present invention can be made without departing from the spirit and scope thereof, it is to be understood that the invention is not limited to the specific embodiments thereof except as defined in the appended claims.

What is claimed is:

1. An SOI annealing method comprising:
the first annealing step of annealing an SOI having a semiconductor layer with a thickness of not more than 200 nm on an insulator in a first reducing atmosphere at a temperature not more than a melting point of silicon; and
the second annealing step of, after the first annealing step, annealing the SOI in an inert atmosphere or a second reducing atmosphere weaker than the first reducing atmosphere at a temperature between 966° C. (inclusive) and the melting point of silicon (inclusive).

2. The method according to claim 1, wherein the annealing temperature in the first annealing step is not less than 775° C.

3. The method according to claim 1, wherein the annealing temperature in the first annealing step is not less than 966° C.

4. The method according to claim 1, wherein the annealing temperature in the first annealing step is not less than 993° C.

5. The method according to claim 1, wherein the first reducing atmosphere is an atmosphere containing hydrogen, and the second reducing atmosphere is an atmosphere in which a concentration of hydrogen gas is not more than 10 vol %.

6. The method according to claim 5, wherein the second reducing atmosphere is an atmosphere in which a concentration of hydrogen gas is not more than 25 vol %.

7. The method according to claim 1, wherein the annealing temperature in the second annealing step is not less than 993° C.

8. The method according to claim 1, wherein the semiconductor layer before the first annealing step contains no COP.

9. The method according to claim 8, wherein the semiconductor layer is formed by epitaxial growth.

10. The method according to claim 1, wherein in the first annealing step, annealing is executed using an induction heater.

11. The method according to claim 1, wherein a nickel concentration on a surface of the semiconductor layer before the second annealing step is not less than $1 \times 10^9$ atoms/cm².

12. An SOI manufacturing method comprising the steps of:
preparing an SOI by forming a semiconductor layer on a substrate; and
executing the annealing method of claim 1 for the SOI.

13. An SOI annealed by the annealing method of claim 1.

14. An SOI annealed by the annealing method of claim 1 and having an HF defect density of not more than 0.05 defects/cm².

15. The method according to claim 1, wherein the second annealing step is executed after the first reducing atmosphere for the first annealing step in an annealing furnace is replaced with the other atmosphere for the second annealing step.

16. An SOI annealing method wherein an SOI having a semiconductor layer with a thickness of not more than 200 nm on an insulating surface is annealed in an inert atmosphere at a temperature between 966° C. (inclusive) and the melting point of silicon (inclusive).

17. The method according to claim 16, wherein the annealing temperature in the annealing is not less than 993° C.

18. The method according to claim 16, wherein the inert atmosphere is an atmosphere containing nitrogen gas.

19. The method according to claim 16, wherein the inert atmosphere is an atmosphere containing a rare gas.

20. The method according to claim 16, wherein the inert atmosphere is an atmosphere containing argon gas.

21. The method according to claim 16, wherein the semiconductor layer is formed by epitaxial growth.

22. The method according to claim 16, wherein a nickel concentration on a surface of the semiconductor layer before the annealing step is not less than $1 \times 10^9$ atoms/cm².

23. An SOI manufacturing method comprising the steps of:

preparing an SOI by forming a semiconductor layer on a substrate; and executing the annealing method of claim 16 for the SOI.

24. An SOI annealed by the annealing method of claim 16.

25. An SOI annealed by the annealing method of claim 16 and having an HF defect density of not more than 0.05 defects/cm².

26. An SOI annealing method comprising:

the first annealing step of annealing an SOI having a semiconductor layer with a thickness of not more than 200 nm on an insulator in a first reducing atmosphere at a temperature not more than a melting point of silicon; and the second annealing step of, after the first annealing step, annealing the SOI in an inert atmosphere or a second reducing atmosphere weaker than the first reducing atmosphere at a temperature between a eutectic temperature of a semiconductor metal compound formed from a metal and a semiconductor material of the semiconductor layer (inclusive) and the melting point of the semiconductor material (inclusive).

27. An SOI manufacturing method comprising the steps of:

preparing an SOI by forming a semiconductor layer on a substrate; and executing the annealing method of claim 26 for the SOI.

28. An SOI annealed by the annealing method of claim 26.

29. An SOI annealed by the annealing method of claim 26 and having an HF defect density of not more than 0.05 defects/cm².

30. The method according to claim 26, wherein the second annealing step is executed after the first reducing atmosphere for the first annealing step in an annealing furnace is replaced with the other atmosphere for the second annealing step.

31. An SOI annealing method wherein an SOI having a semiconductor layer with a thickness of not more than 200 nm on an insulator is annealed in an inert atmosphere at a temperature between a eutectic temperature of a semiconductor metal compound formed from a metal and a semiconductor material of the semiconductor layer (inclusive) and a melting point of the semiconductor material (inclusive).

32. An SOI manufacturing method comprising the steps of:

preparing an SOI by forming a semiconductor layer on a substrate; and executing the annealing method of claim 20 for the SOI.

33. An SOI annealed by the annealing method of claim 31.

34. An SOI annealed by the annealing method of claim 31 and having an HF defect density of not more than 0.05 defects/cm².

* * * * *